US008784171B2

(12) United States Patent
Reed

(10) Patent No.: US 8,784,171 B2
(45) Date of Patent: Jul. 22, 2014

(54) METHOD AND APPARATUS FOR MODELING A TRACK IN VIDEO GAMES USING ARCS AND SPLINES THAT ENABLES EFFICIENT COLLISION DETECTION

(75) Inventor: Colin Reed, Redmond, WA (US)

(73) Assignee: Nintendo Co., Ltd., Kyoto (JP)

(*) Notice: Subject to any disclaimer, the term of this patent is extended or adjusted under 35 U.S.C. 154(b) by 2306 days.

(21) Appl. No.: 10/637,041

(22) Filed: Aug. 8, 2003

(65) Prior Publication Data

US 2004/0121829 A1 Jun. 24, 2004

Related U.S. Application Data

(60) Provisional application No. 60/435,331, filed on Dec. 23, 2002.

(51) Int. Cl.
*A63F 9/24* (2006.01)
(52) U.S. Cl.
USPC .................................. 463/6; 463/23
(58) Field of Classification Search
USPC ............... 463/6, 1, 30–34, 23; 345/141, 6, 345/418–420, 441–443, 584, 662, 629
See application file for complete search history.

(56) References Cited

U.S. PATENT DOCUMENTS

| 5,459,820 | A | * | 10/1995 | Schroeder et al. | 345/420 |
| 5,471,574 | A | * | 11/1995 | Prasad | 345/442 |
| 5,572,639 | A | * | 11/1996 | Gantt | 345/651 |
| 5,627,949 | A | * | 5/1997 | Letcher, Jr. | 345/420 |
| 6,014,148 | A | * | 1/2000 | Tankelevich | 345/442 |
| 6,636,217 | B1 | * | 10/2003 | Hill | 345/441 |
| 6,853,373 | B2 | * | 2/2005 | Williams et al. | 345/419 |
| 6,940,538 | B2 | * | 9/2005 | Rafey et al. | 348/157 |
| 7,000,197 | B1 | * | 2/2006 | Bou et al. | 715/812 |
| 7,218,326 | B1 | * | 5/2007 | Bogues et al. | 345/442 |
| 2002/0044081 | A1 | * | 4/2002 | Cong | 342/70 |
| 2003/0109296 | A1 | * | 6/2003 | Leach et al. | 463/6 |
| 2004/0135677 | A1 | * | 7/2004 | Asam | 340/425.5 |

* cited by examiner

*Primary Examiner* — Pierre E Elisca
(74) *Attorney, Agent, or Firm* — Nixon & Vanderhye, PC

(57) ABSTRACT

A method and apparatus for modeling a track in video games that enables efficient collision detection between a game object (such as a racecar wheel) and the track. The invention provides an infinitely smooth track for use in collision detection through the novel use of arcs and splines. The invention enables relatively small amounts of data to be used to model and express relatively large gameplay courses, such as race tracks and the like. The arcs and splines enables quick and efficient look-up of the location of the tire on the track and calculation of the distance from the wheel to the track for loading purposes.

9 Claims, 12 Drawing Sheets

METHOD AND APPARATUS FOR MODELING A TRACK IN VIDEO GAMES USING ARCS AND SPLINES THAT ENABLES EFFICIENT COLLISION DETECTION

RELATED APPLICATION

This application claims priority on U.S. Provisional Application Ser. No. 60/435,331 filed Dec. 23, 2002, the entire content of which is incorporated by reference herein.

FIELD OF THE INVENTION

The instant invention relates to video game systems and, more particularly, to an improved method and apparatus for modeling a track in video games that enables efficient collision detection between a game object (such as a racecar wheel) and the track. The invention provides an infinitely smooth track (e.g., road) for use in collision detection through the novel use of arcs and splines. The invention enables relatively small amounts of data to be used to model and express relatively large gameplay courses, such as race tracks and the like. A primary benefit of the invention when used in racecar games, is that it enables quick and efficient look-up of the location of the tire on the track and calculation of the distance from the wheel to the track for loading purposes.

BACKGROUND AND SUMMARY OF THE INVENTION

Most prior art racing video games use polygon collision detection for modeling the interaction between the race track and the racecar. Today's technology allows very realistic physics to be used to model the cars used in racecar games. For example, the suspension and tire friction of the virtual cars are very sensitive to load changes (i.e., the amount of weight that is on the tire). These realistic cars can provide much more realistic and exciting gameplay for the user. However, when polygons are used to express the road, the surface of the road abruptly changes direction each time a polygon vertex is reached. FIG. 1 illustrates this point and shows a section of a polygon track 200 with vertexes 204 and 206. As can be seen from FIG. 1, the polygon track presents a piece-wise linear surface on which the car tire 206 rides. As the car tire passes over vertex 204, the tire 206 will suddenly lose contact with the road 200. This will occur again when the tire 206 passes over vertex 202. The number of polygons can be increased in order to help smooth the road surface. However, the polygon surface still remains piece-wise linear. Moreover, increasing the number of polygons becomes expensive and eventually impractical in terms of CPU time. Thus, most prior art racing games that use polygons for the road surface have relatively abrupt vertices that detrimentally impact the performance of the cars and prevent true tire loading from being used in the model. This impact is further magnified as the sophistication of the car modeling in terms of suspension, tire friction and the like increases. Thus, when sophisticated cars are used on a polygon based track, the polygon-based collision detection becomes a problem in terms of car performance and handling. For example, every time a tire on the car comes off of a polygon (i.e., passes from one polygon to the next) the tire experiences a large load change (like jumping off a ramp). In other words, as soon as the tire goes over a vertex on the piece-wise linear surface defined by the polygons, the load will suddenly and drastically decrease or increase (depending on the nature or direction of the vertex), thereby causing the car to suddenly react in a manner that could cause a spin-out or other type of undesirable control problem that reduces the enjoyment of the game. As a result, most racecar games do not use realistic tire loading and/or use blending techniques to minimize the effect of the load changes. However, these techniques limit the realism of the game. Real cars have tires connected to the body of the car with suspension and a spring or shock absorber that enables the tire to rotate relative to the car within the constraints of the suspension and in response to loading of the tire. FIG. 4 depicts an exemplary car with car body 208 connected to two wheels (210, 212) through suspension 214 and springs 220 Thus, in order to realistically model a car in a game, accurate loading and suspension effects should be used. Otherwise, a turning car will not look realistic, as indicated by the car 208' of FIG. 5. In order to be realistic, the turning car should look more like FIG. 6 in which the suspension effect and tire loading can be seen. Thus, further improvements in track modeling and collision detection are needed for racecar games and the like.

The instant inventor realized that by specifying the track as a spline (rather than by polygons), the surface will be smooth which prevents the vertex problem described above and enables the tire to maintain contact with the road. FIG. 2 illustrates the infinitely smooth road 222 that results from the use of a spline 224. As indicated by FIG. 3, splines can be used on a patch, such as a patch 228 that has various control points 230 that can be manipulated to define a specific splined surface 232 for the patch. However, using patches and splines in this manner creates a problem in that finding the distance from the tire to the surface for load calculations is very complex. Specifically, in order to make an accurate calculation, the patch 228 must be repeatedly subdivided to locate the tire on the patch and then to determine the distance from the patch. This calculation procedure is very expensive in terms of CPU processing time. Thus, improvements are needed in surface modeling that enables splines to be used for collision detection in an efficient and advantageous manner, and which thereby enable sophisticated car modeling, in terms of tire loading, suspension, friction and/or the like, to be used without the adverse affects resulting from polygon modeling.

The present invention addresses this need by providing an improved method and apparatus for using splines in track modeling. In the preferred embodiment, the system of the invention uses arcs and splines to calculate 200 times a second where, for a given piece of road and car state, how much the tire has penetrated into the road. This information is then used to force the tire back up, which forces the suspension back up and, in turn, forces the body up through the springs (see FIG. 4). This enables very realistic car modeling. For example, the tire no longer has to be displayed as always parallel to the body (i.e., with no camber changes), as seen in FIG. 5. Instead, the instant invention enables sophisticated car modeling to be used that provides for tire camber changes based on suspension load, as indicated in FIG. 6. However, in order to use this sophisticated car modeling, accurate tire loading is needed. The arc and spline-based modeling of the instant invention enables accurate tire loading to be used in an efficient and advantageous manner, thereby enabling much more realistic car modeling (in terms of suspension etc.) to be used.

In accordance with the instant invention, arcs are used to represent the curved sections of a track, and splines (e.g., one-dimensional Hermite Splines) are defined around the arcs to specify the height changes for each arc (e.g., each side of the road), thereby enabling complex roads (or other tracks) to be modeled in a very efficient and smooth manner, as compare to prior art techniques. The invention defines a track by defining straight track sections (defined by length) and arced track sections (defined by distance or radius and angles). As explained in greater detail below, splines are defined through the arcs for use in defining the track surface and edges. The length and angles of the arced sections can vary such that any desired type of curved section can be defined for the track. In this way, the track can be defined as a series of straight sections and a series of different arced sections. In accordance with the invention, the track (straights and arcs) are first defined in top-down, plan 2D manner and then the height of the track is applied later. As a result, one can use aerial maps of real racetracks and then lay out the series of straights and arcs in a manner that corresponds to the real track. All real-world tracks have turns defined by the number of degrees and the meter radius of the corner. Thus, the invention is very applicable to real-world modeling of tracks. In addition to the track itself, medians, grass areas, banks and/or other inner or outer arced sections can be defined for each arced road section. Each section can then be defined with a different texture.

Once the 2-D arcs are defined, the splines are then defined to add height to each road section. The spline data can also be used to, for example, add objects to the track, like a fence. In other words, the spline data can be used to generate graphics for the track. As a result, the invention provides the option of having an artist first lay out the track and then apply the straights and arcs thereon, or, alternatively, having the graphics generated directly from the defined arcs and straights. The inventor has developed a test track using the instant invention wherein sixty random arcs are joined together to define a five mile course. Thus, the invention makes it very easy to create very long and interesting courses with many objects, such as trees, and using far less resources as compared to the polygon method.

In accordance with the invention, the elevation of the arcs are defined by specifying an elevation (e.g., in meters) and a height change for the start and the end points of the arc. Then the spline data is generated using a Hermite Spline interpolation. A spline is a parametric curve defined by some control points. A Hermite Spline is known as a curve (typically cubic) for which the user provides the end points of the curve and the parametric derivatives of the curve at the end points. A point on a Hermite curve can be obtained by multiplying each control point by some function and summing. In other words, in the instant invention, the height and the height change is blended from one end point to the other end point over the curve, thereby defining the Hermite Spline data for the arc.

In accordance with the invention, a bounding box is defined for each arc and straight section of the track. The bounding boxes are used to quickly determine if the wheels are anywhere within the area defined by the bounding box. This simplifies testing for the location of the wheels by doing a rough test first in order to eliminate many bounding boxes (and the corresponding sections of track) as possibilities for the location of the wheels. Once it is determined that a wheel is in a bounding box, a 2D test is run to determine whether the wheel in the bounding box is within the minimum and maximum radius of the arc segment. If not, the wheel is not in the arc segment. On the other hand, if the wheel is within the arc segment, a calculation is done to determine how far the wheel is around the arc (arc angle U), in order to determine how the spline is interpolating at that point. Thus, a normalized distance value (0 to 1 value) from the center of the arc is obtained. With this value, the height and elevation change of the arc at the determined points can be determined, thereby providing the data for the Hermite Spline. Next, a temporary plane is found for arc angle U, which is the plane in which the collision may occur. The temporary plane is defined by the normal perpendicular to the road at angle U and the distance from the origin. Then, a calculation is performed to find the distance between the wheel (modeled as a sphere) and that plane. An advantage of the invention is that the above process only needs to be done once per arc segment which is much more efficient than a polygon technique. Once the distance is obtained, it is known how far the tire has embedded itself into the road, thereby enabling a corresponding force to be applied to the tire. This process simulates the compression of the tire under weight. Also, because the angle of the temporary plane is known, the camber angle of the tire can also be determined for simulation purposes (e.g., adjusting frictional values). The force can be changed to simulate air pressure. Once the force is applied to the tire, the car modeling causes resulting forces to the car through the suspension and body modeling, thereby providing a very realistic auto racing game or the like.

BRIEF DESCRIPTION OF THE FIGURES

Other objects, features and advantages of the instant invention will be further understood from review of the following detailed description of the preferred embodiments when read in conjunction with the appended figures, in which.

DETAILED DESCRIPTION OF THE PREFERRED EMBODIMENTS

Figure 7:
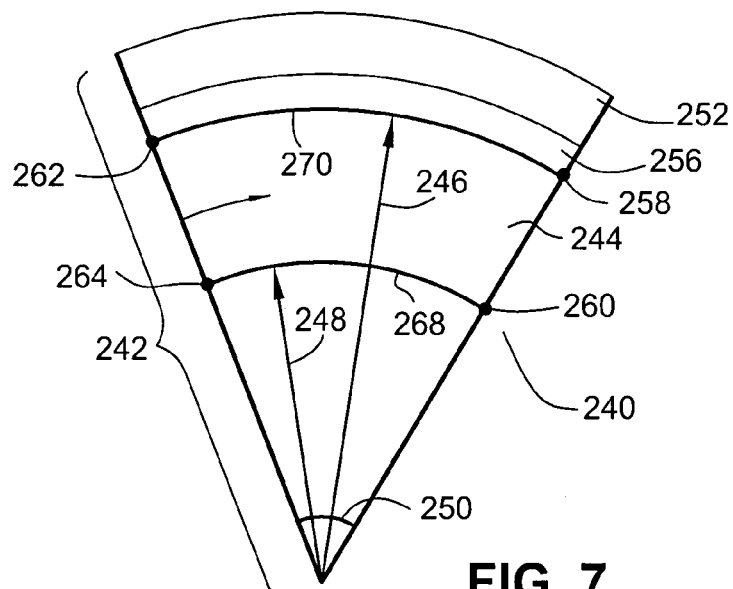
FIG. 7 depicts an exemplary arced section having a given radius length and angle as used in accordance with the instant invention.

In accordance with the instant invention, arcs are used to represent the curved sections of a track, and splines (e.g., one-dimensional Hermite Splines) are defined around the arcs to specify the height changes for each arc (e.g., each side of the road), thereby enabling complex roads (or other tracks) to be modeled in a very efficient and smooth manner, as compare to prior art techniques. The invention defines a track by defining straight track sections (defined by length) and arced track sections (defined by radius and angles). As explained is greater detail below, splines are defined through the arcs for use in defining the track height through the arc. The length and angles of the arced sections can vary such that any desired type of curved section can be defined for the track. FIG. 7 shows an exemplary arc section 240 as used in accordance with the instant invention. A radius 242 is defined together with an angle 250 for the arc. In this way an arc section is defined. Within that arc section, a maximum radius 246 and minimum radius 248 are defined in order to define a track section 244 between arcs 268 and 270. Other arc sections, like 252 and 256 can also be defined in this manner to express banks, grassy areas or any other outer or inner section for the track 244. These outer or inner sections are not required, but can be used to provide additional features for the track, such as off-road sections. The track section 244 includes four end points 258, 260, 264 and 262 that represent the end points of the arcs 268 and 270 and define an arc section for the track. In accordance with the invention, a complete track is made by defining a plurality of these arc sections 244, each with a different radius (and min. and max.) and angle and then connecting the arcs together to form the track. The track can also include straight sections.

Figure 10:
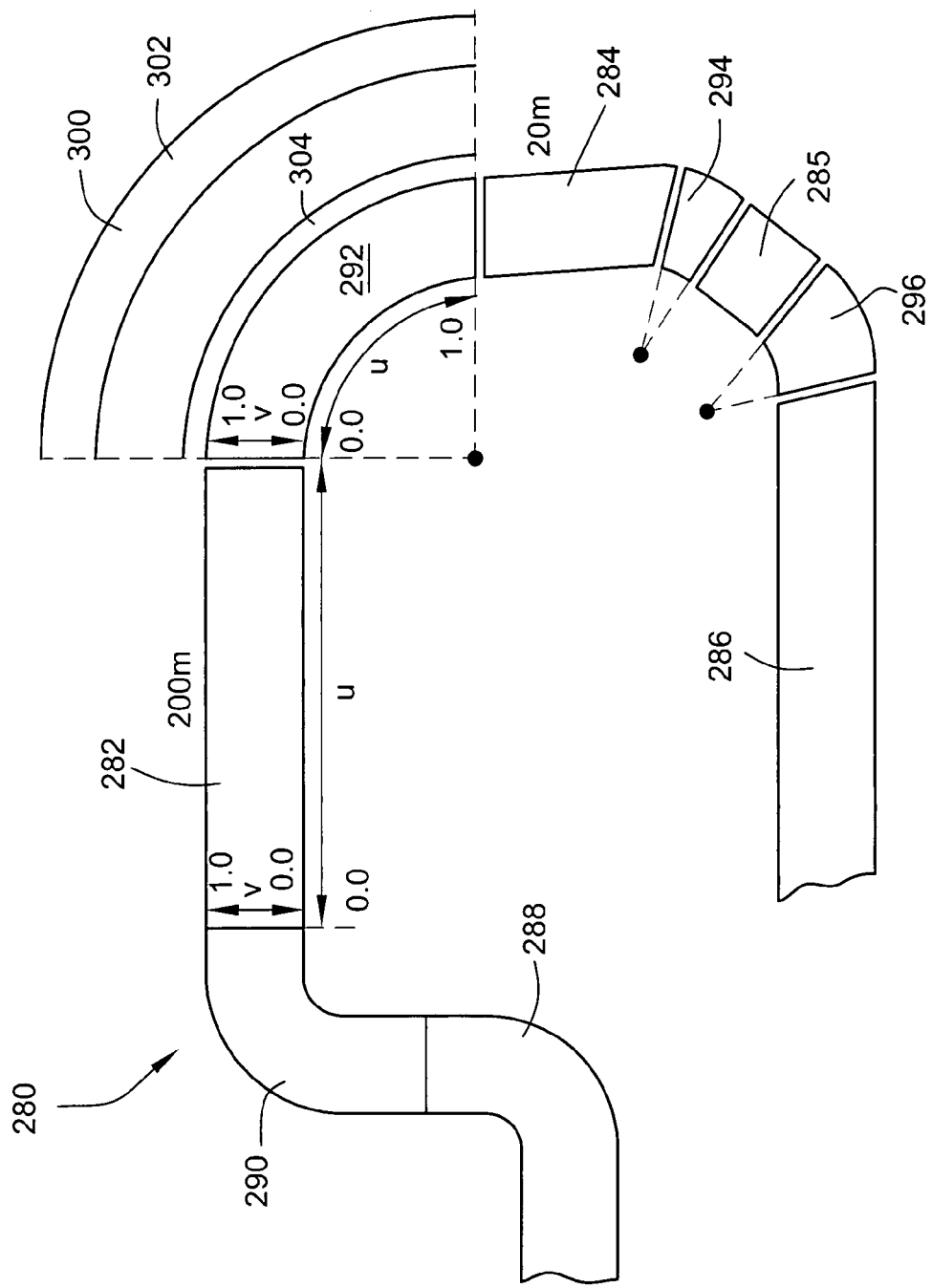
FIG. 10 depicts an aerial view of an exemplary track defined in accordance with the instant invention.

FIG. 10 shows an exemplary track 280 defined in accordance with the present invention. The track 280 is defined as a series of straight sections (282, 284, 285, 286) and a series of different arced sections (288, 290, 292, 294, 296). In accordance with the invention, the track (straights and arcs) are first defined in top-down, plan 2D manner and then the height of the track is applied later. As a result, one can use aerial maps of real racetracks and then lay out the series of straights and arcs in a manner that corresponds to the real track. All real-world tracks have turns defined by the number of degrees and the meter radius of the corner. Thus, the invention is very applicable to real-world modeling of tracks. In addition to the track itself, medians, grass areas, banks and/or other inner or outer arced sections can be defined for each arced road section. FIG. 10 shows these additional outer arched sections (300, 302, 304) for arc section 292 only. Each of these outer arc sections (300, 302, 304) can then be defined with a different texture to represent various off road terrain or the like. As can be seen in FIG. 10, the radius and angle for each arc is different, thereby providing a different type of road section. Once the various arcs are defined, they can be combined and repeated to define a very long and complex track. As indicated on track sections 282 and 292, any specific location on the track can be defined by the normalized values U and V, wherein V represents the normalized distance from the origin and U represents the distance along the track section.

Once the 2-D arcs are defined, as explained in connection with FIGS. 7 and 10, the splines are then defined to add height to each road section. The spline data can also be used to, for example, add objects to the track, like a fence. In other words, the spline data can be used to generate graphics for the track. As a result, the invention provides the option of having an artist first lay out the track and then apply the straights and arcs thereon, or, alternatively, having the graphics generated directly from the defined arcs and straights. The inventor has developed a test track using the instant invention wherein sixty random arcs are joined together to define a five mile course. Thus, the invention makes it very easy to create very long and interesting courses with many objects, such as trees, and using far less resources as compared to the polygon method.

Figure 13:
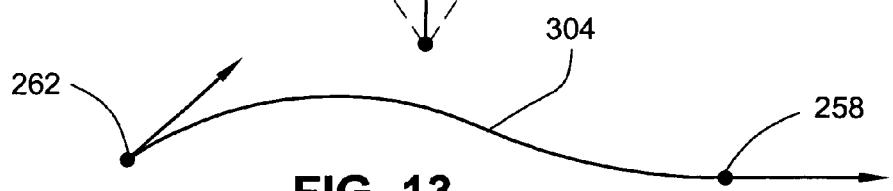
FIG. 13 depicts two exemplary end point of an arc with the resulting Hermite Spline therebtween.

In accordance with the invention, the elevation of the arcs are defined by specifying an elevation (e.g., in meters) and a height change for the start and the end points of the arc. Specifically, with reference to FIG. 7, the height and height change at each of the end points 258, 260, 262 and 264 are defined. Then the spline data is generated using a Hermite Spline interpolation. As one skilled in the art understands, a spline is a parametric curve defined by some control points. A Hermite Spline is known as a curve (typically cubic) for which the user provides the end points of the curve and the parametric derivatives of the curve at the end points. A point on a Hermite curve can be obtained, in a known manner, by multiplying each control point by some function and summing. In other words, in the instant invention, the height and the height change is blended from one end point (e.g., 262) to the other end point (258) over the arc 270, thereby defining the Hermite Spline data for the arc 270. FIG. 13 provides a simplified view of this spline generation. A height and rate of height change are defined for both end points 262 and 258, and then the Hermite Spline interpolation is used to determine the spline 304 therebetween.

Figure 1:
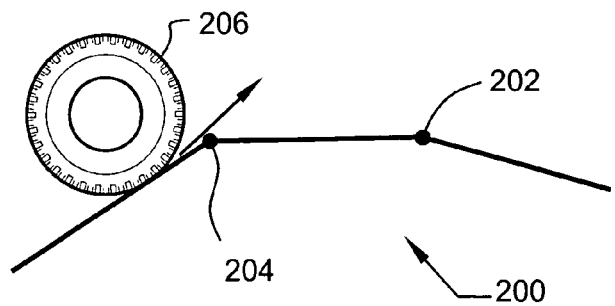
FIG. 1 depicts an exemplary section of a piece-wise linear track resulting from polygon data.
Figure 2:
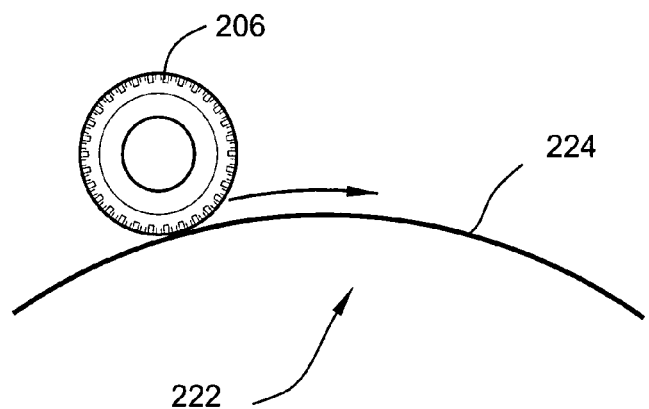
FIG. 2 depicts an exemplary curved track provided by the spline technique of the instant invention.
Figure 3:
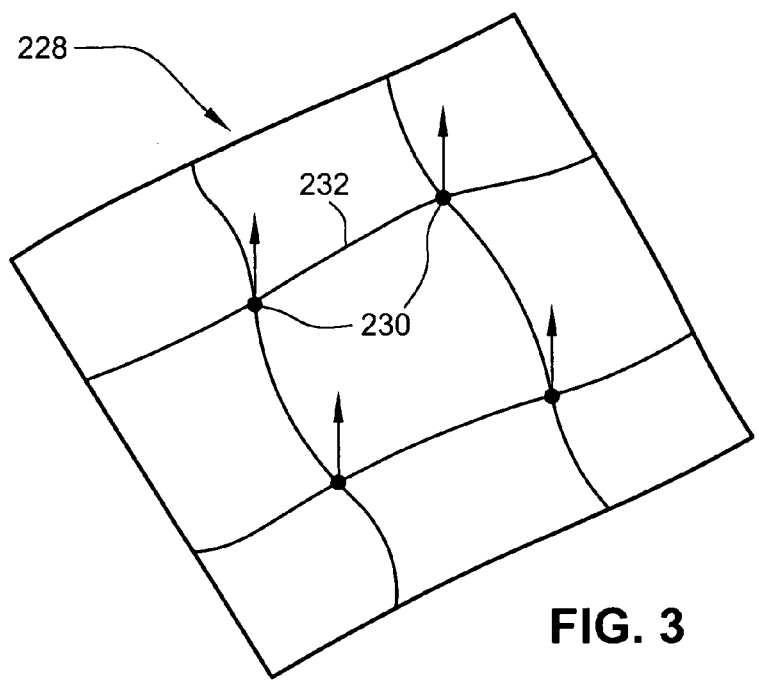
FIG. 3 depicts a patch with control points and resulting splines.
Figure 4:
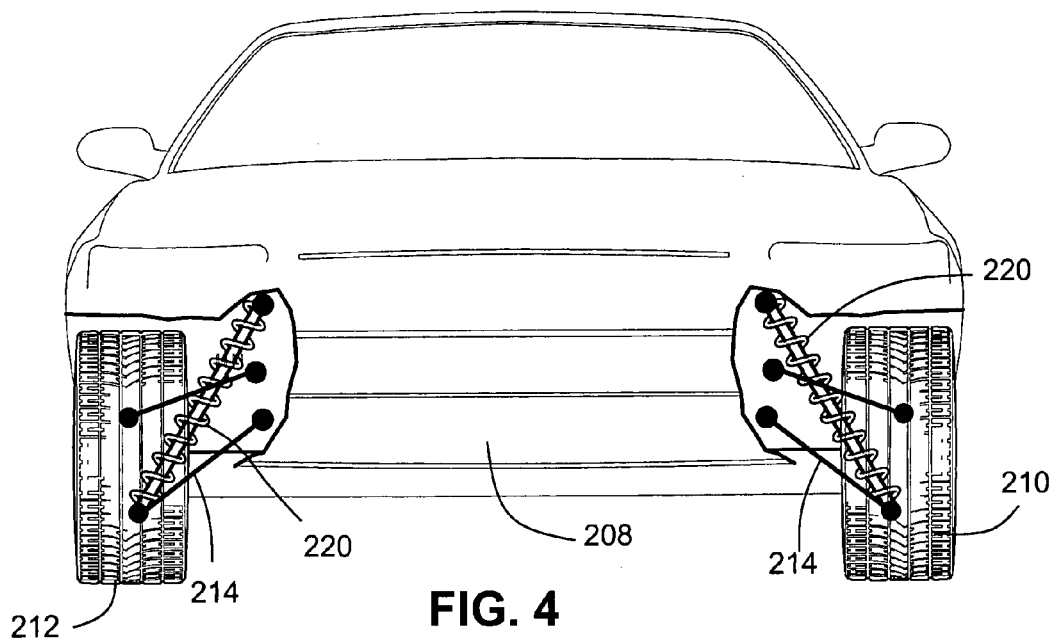
FIG. 4 depicts car tires being connected to a car body via suspension
Figure 5:
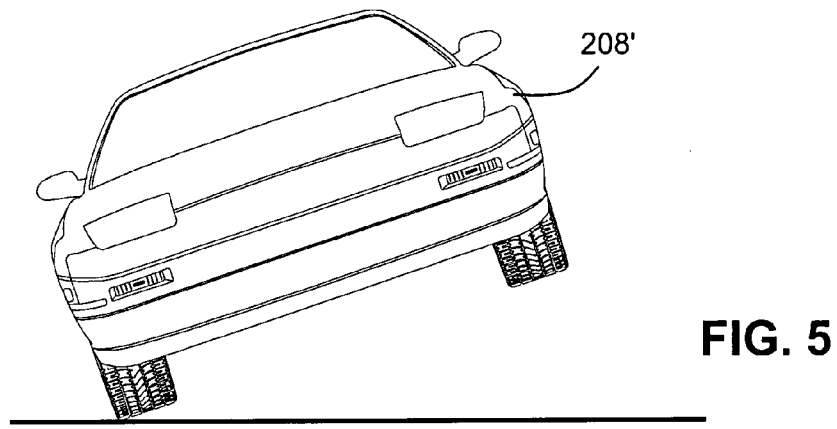
FIG. 5 depicts a turning car that does not have realistic suspension modeling.
Figure 6:
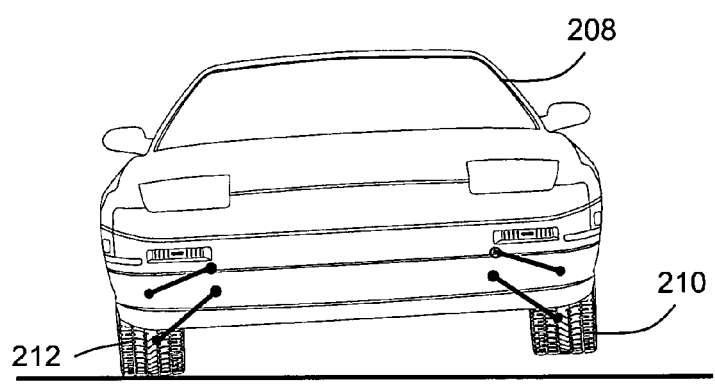
FIG. 6 depicts a turning car with more realistic suspension modeling as envisioned for use in connection with the instant invention.
Figure 8:
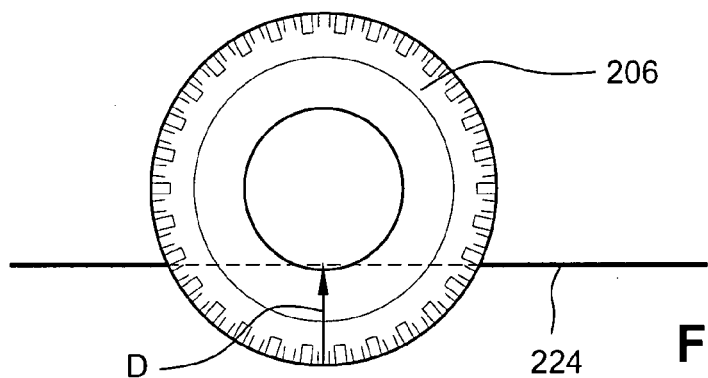
FIG. 8 depicts a collision between a tire and the road, as determined in accordance with the instant invention.
Figure 9:
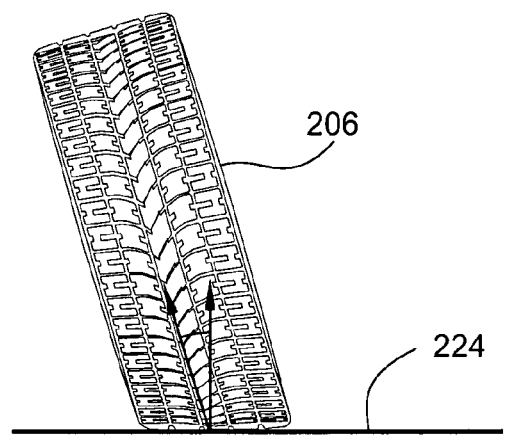
FIG. 9 depicts a tire experiencing a camber change as a result of the suspension modeling.
Figure 12:
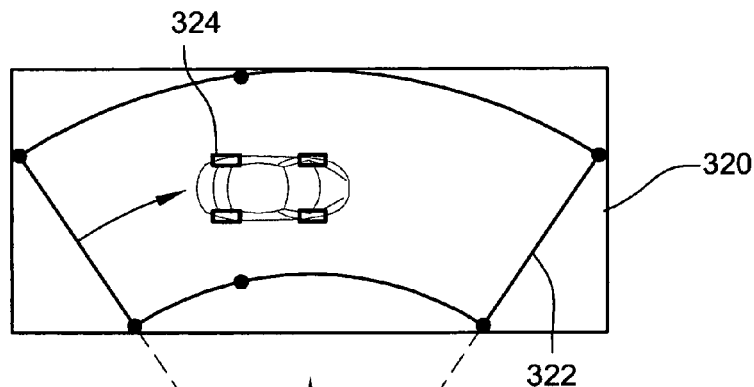
FIG. 12 depicts an arced section of track and the associated bounding box.

In accordance with the invention, a bounding box is defined for each arc and straight section of the track. For an arc section the bounding box is preferably a box that encompasses the four end points of the track section. An exemplary bounding box 320 is shown in FIG. 12 for arc section 322. For straight track sections, the bounding box simply conforms to the track section. The bounding boxes are used to quickly determine if a wheel is anywhere within the area defined by the bounding box. For example, as shown in FIG. 12, the bounding box 320 is tested to see if the wheel 324 is within the bounding box. This simplifies testing for the location of the wheels by doing a rough test first in order to eliminate many bounding boxes (and the corresponding sections of track) as possibilities for the location of the wheels. Once it is determined that a wheel is in a bounding box, a 2D test is run to determine whether the wheel in the bounding box is within the minimum and maximum radius of the arc segment. For example, when the bounding box 320 of FIG. 12 is checked, it is determined that the wheel 324 is within the box. Obviously, if the wheel 324 is not in the bounding box 320, the wheel cannot be within the arc section 322. On the other hand, if the wheel is in the bounding box and the wheel is within the arc segment, a calculation is done to determine how far the wheel is around the arc (arc angle U), in order to determine how the spline is interpolating at that point. Thus, normalized U and V distance values (0 to 1 values) are obtained. With these values, the height and elevation change of the arc at the determined points can be determined, thereby providing the data for the Hermite Spline. Next, a temporary plane is found for arc angle U, which is the plane in which the collision may occur. The temporary plane is defined by the normal perpendicular to the road at angle U and the distance from the origin. Then, a calculation is performed to find the distance between the wheel (modeled as a sphere) and that plane. In advantage of the invention is that the above process only needs to be done once per arc segment which is much more efficient than a polygon technique. Once the distance is obtained, it is known how far the tire has embedded itself into the road, thereby enabling a corresponding force to be applied to the tire. This process simulates the compression of the tire under weight. This process is also illustrated in FIG. 8, wherein the tire 206 is shown as being embedded into the road 224 by distance D. This distance D determines how much force is being applied to the tire at that time. Also, as shown in FIG. 9, because the angle of the temporary plane is known, the camber angle of the tire 206 relative to the normal for the road 224 can also be determined for simulation purposes (e.g., adjusting frictional values). The force on the tire 206 caused by the distance D can be changed to simulate tire air pressure. Once the force is applied to the tire, the car modeling causes resulting forces to the car through the car suspension and body modeling (see FIGS. 4 and 6), thereby providing a very realistic auto racing game or the like.

Figure 11:
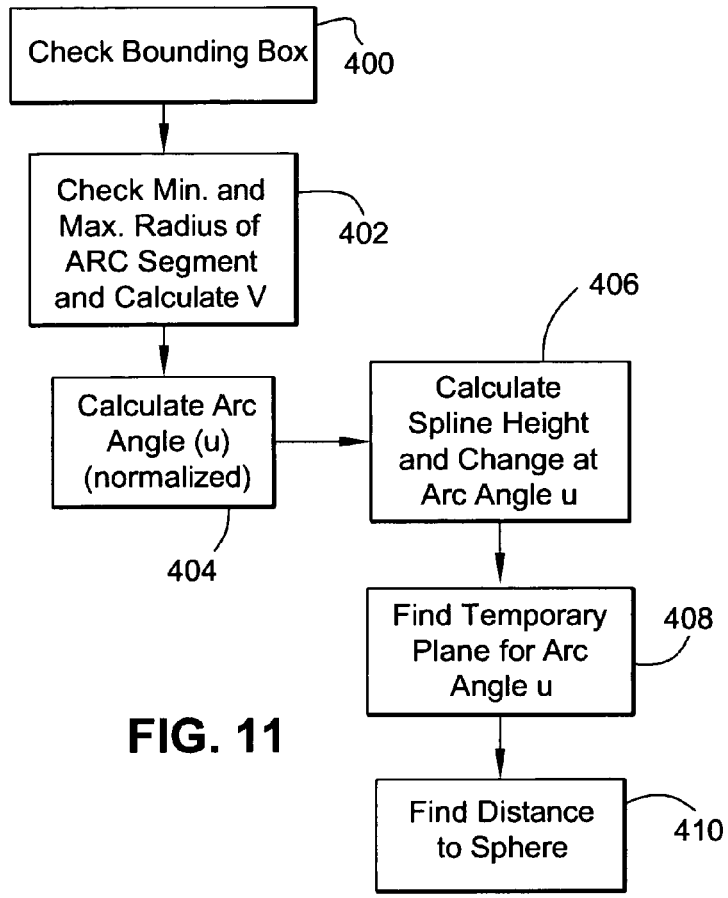
FIG. 11 is a flow chart of the main steps used to perform collision detection in an arced track section in accordance with the instant invention.

FIG. 11 shows a simplified flow chart of the main steps performed in accordance with the preferred embodiment of the instant invention in order to perform collision detection for an arced section of track (e.g., section 292 of FIG. 10). As explained above, the first step (400) involves checking the bounding boxes for the track sections to see if a wheel is within the bounding box. In the next step (402), the minimum and maximum radius of the arc segment is checked to see if the wheel is within the arc segment. If the wheel is in the arc segment, the distance V (normalized) from the origin is calculated. Then, the normalized arc angle U is calculated (step 404), thereby indicating how far the wheel is around the arc. Then in step 406, the spline height and change is calculated for arc angle U. The temporary plane is then defined for arc angle U (step 408). Finally, the distance D to the sphere (wheel) from the track is determined (step 410). This distance D is then used in the manner described above for tire load modeling and effect.

Figure 14:
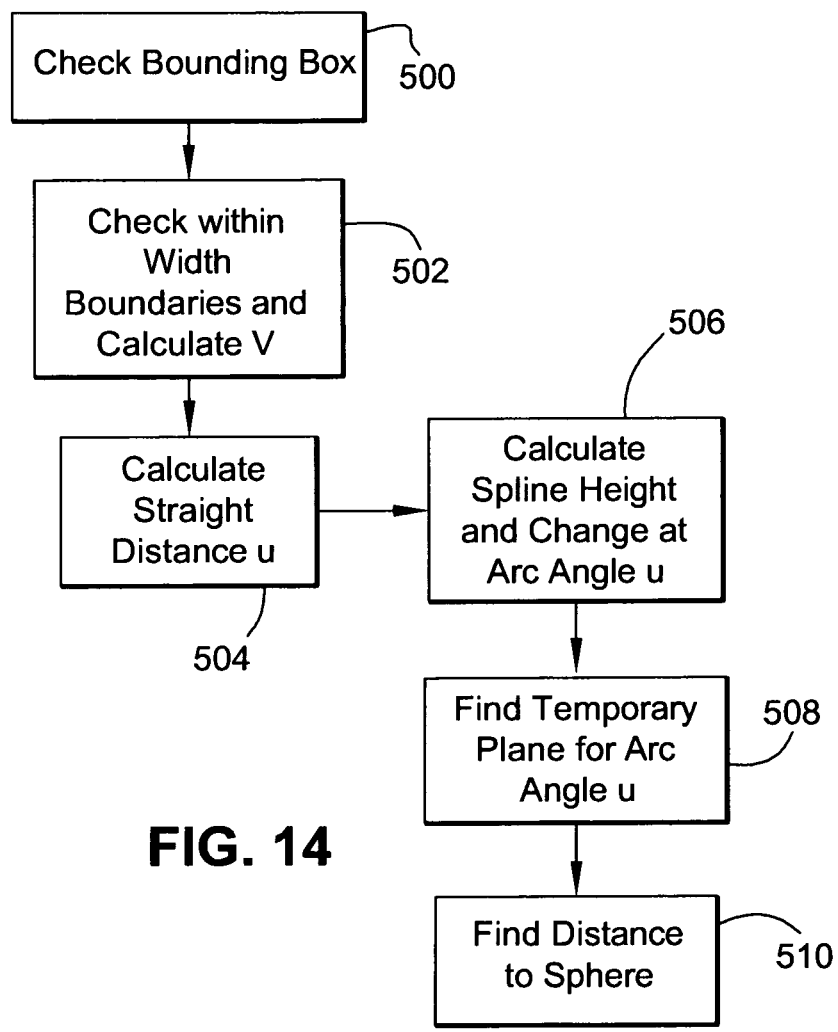
FIG. 14 is a flow chart of the main steps used to perform collision detection in a straight track section in accordance with the instant invention.

FIG. 14 shows a simplified flow chart of the main steps performed in accordance with the preferred embodiment of the instant invention in order to perform collision detection for a straight section of track (e.g., section 282 of FIG. 10). The first step (500) involves checking the bounding boxes for the track sections to see if a wheel is within the bounding box. Of course, for a straight section of track this step determines if the wheel is within the track section, due to the fact that the bounding box preferably matches the track section. In the next step (502), the minimum and maximum width boundaries are checked (optional) to confirm if the wheel is within the segment and then the normalized distance (V) that the wheel is from the lower edge of the track is determined. Then, the distance U is calculated (step 504), thereby indicating how far the wheel is along the straight section. Then in step 506, the spline height and change is calculated for distance U. The temporary plane is then defined for distance U (step 508). Finally, the distance D to the sphere (wheel) from the track is determined (step 510). This distance D is then used in the manner described above for tire load modeling and effect.

Figure 15:
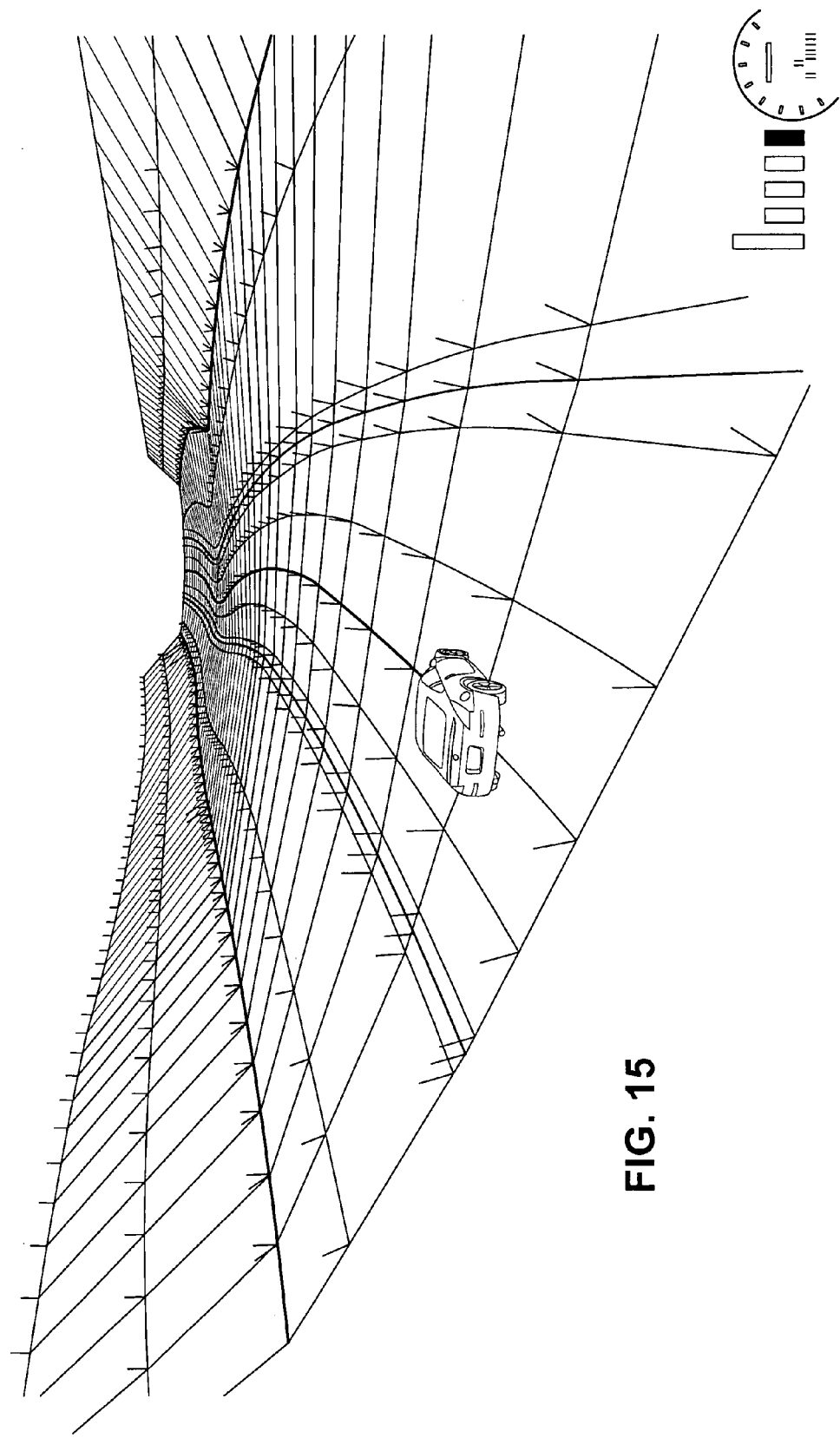
FIG. 15 is a screen shot of an exemplary track showing polygons and normals.
Figure 16:
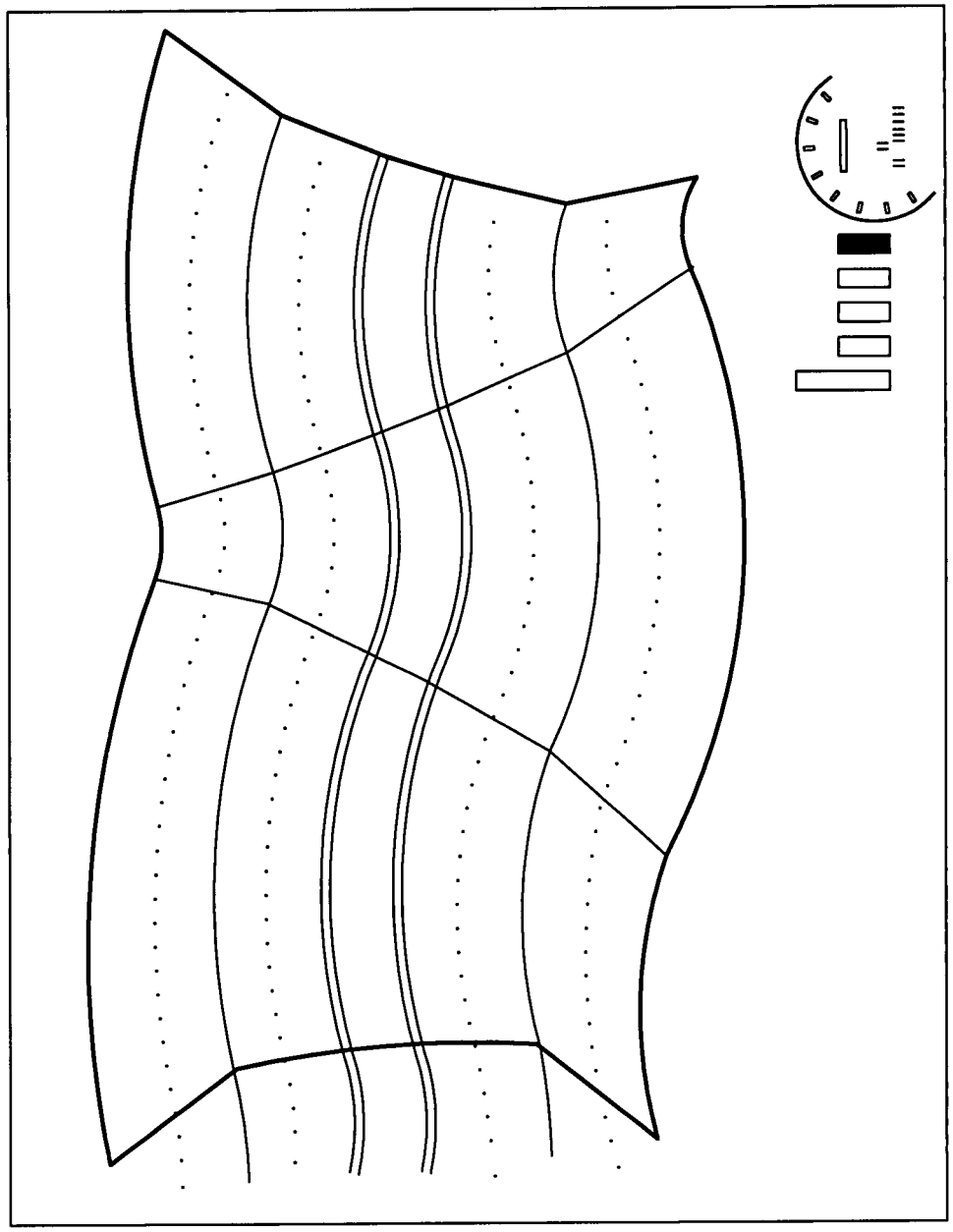
FIG. 16 is a screen shot of an exemplary track having arc sections defined in accordance with the instant invention.
Figure 17:
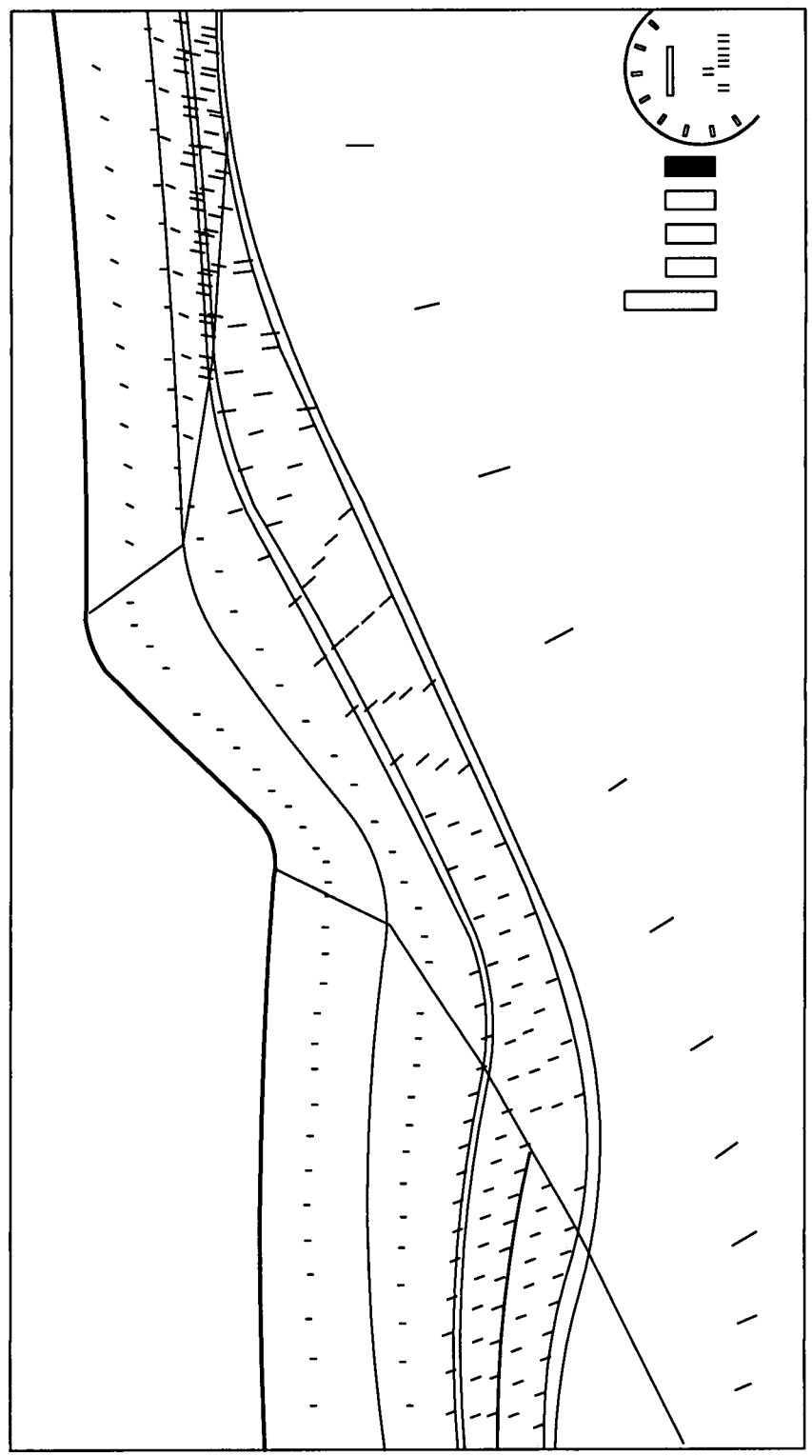
FIG. 17 is another screen shot of an exemplary track having arc sections defined in accordance with the instant invention.
Figure 18:
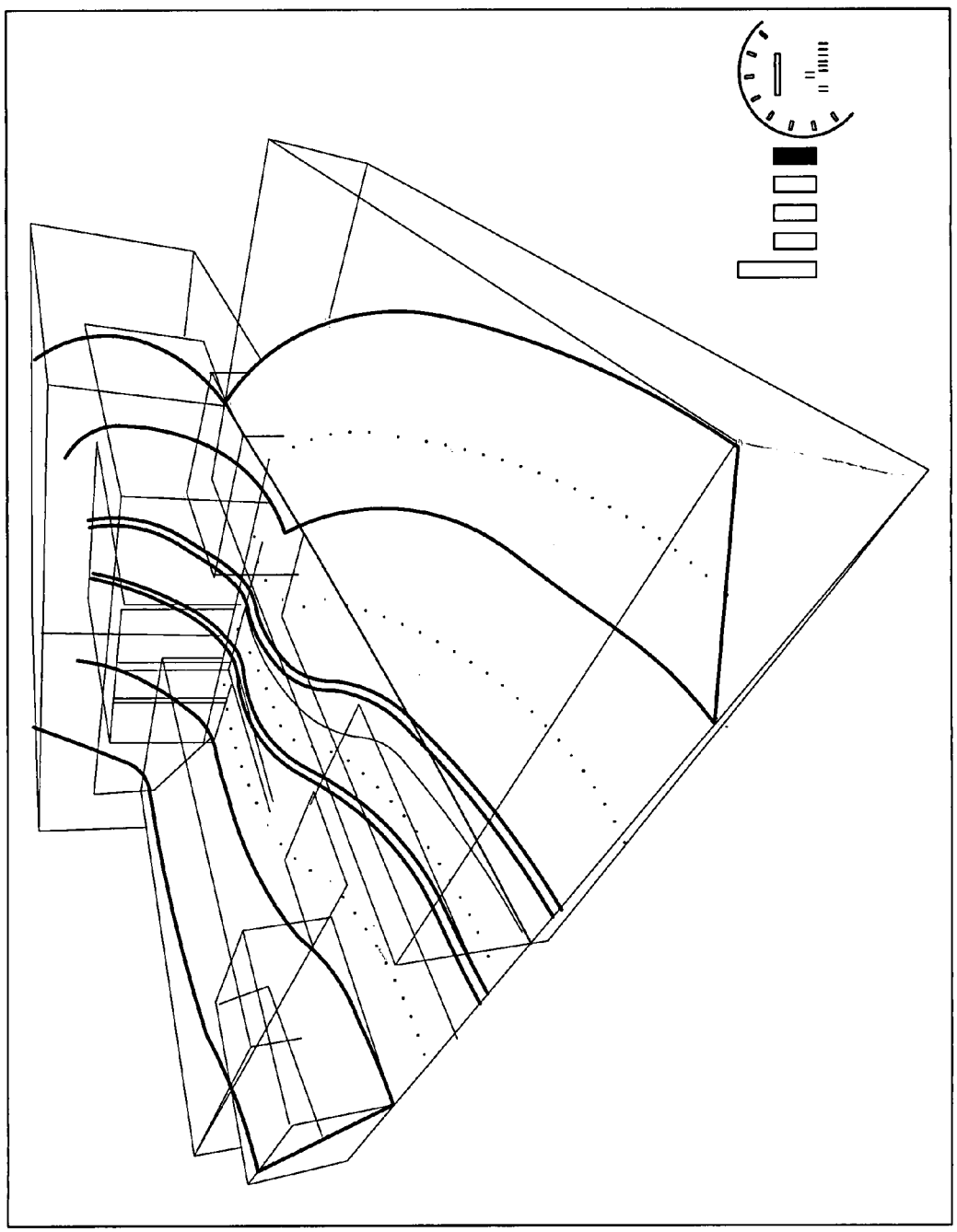
FIG. 18 is a screen shot of an exemplary track showing the bounding boxes defined in accordance with the instant invention.

FIG. 15 shows a screen shot of an exemplary track showing polygons and normals of a type in which the instant invention can be used. In order to further illustrate and exemplary embodiment of the invention, FIG. 16 provides a screen shot of an exemplary track having arc sections defined in accordance with the instant invention. FIG. 17 provides another screen shot of an exemplary track having arc sections defined in accordance with the instant invention. Finally, FIG. 18 is a screen shot of an exemplary track showing the bounding boxes defined for each track section in accordance with the instant invention.

Example Illustrative Implementation

Figure 19:
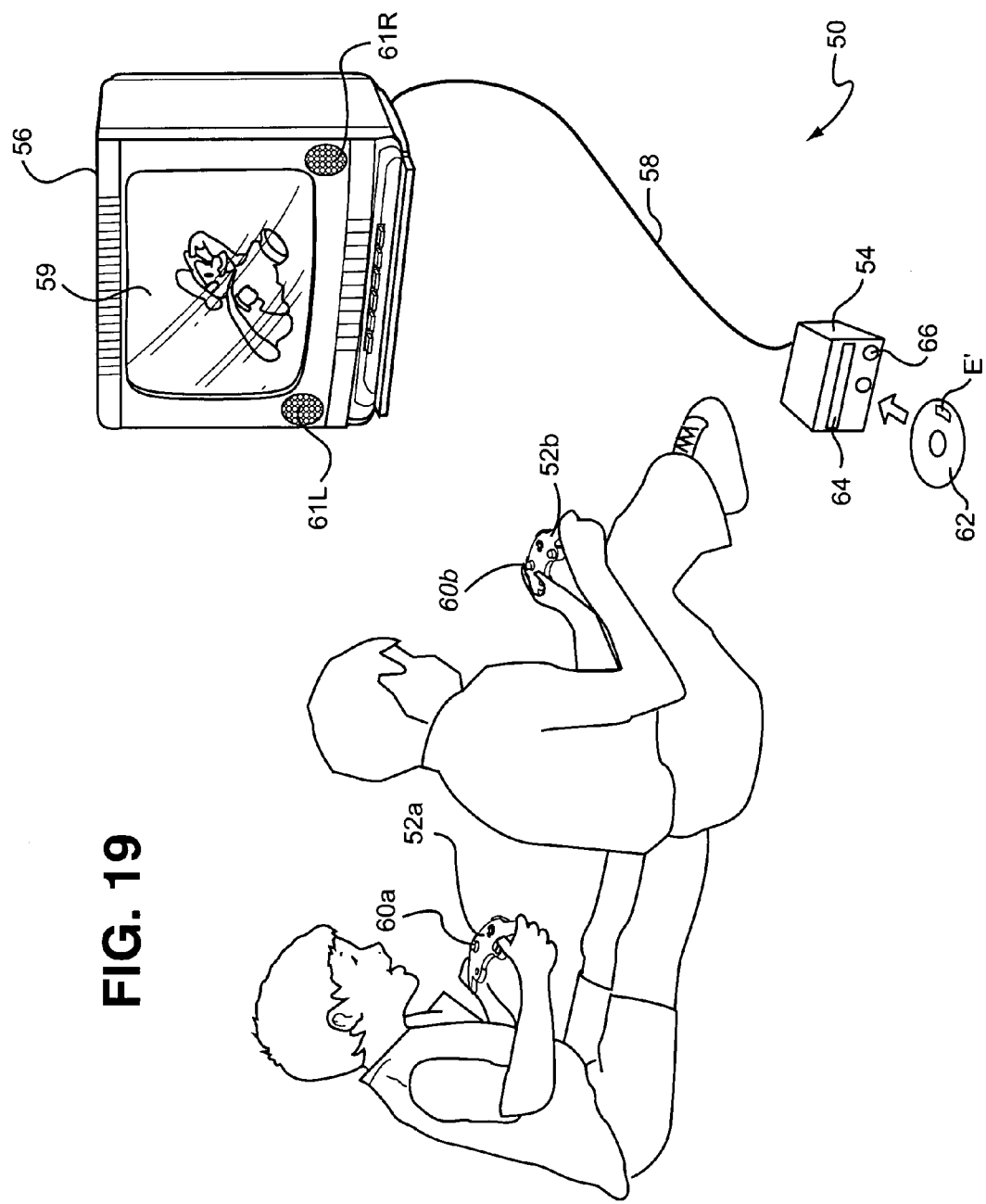
FIGS. 19 and 20 illustrate an example system that can be used to generate the displays of FIGS. 15-18 and to implement the collision detection system of instant invention.

FIG. 19 shows an example interactive 3D computer graphics system 50. System 50 can be used to play interactive 3D video games with interesting animation and collision detection provided by a preferred embodiment of this invention. System 50 can also be used for a variety of other applications.

In this example, system 50 is capable of processing, interactively in real time, a digital representation or model of a three-dimensional world. System 50 can display some or the entire world from any arbitrary viewpoint. For example, system 50 can interactively change the viewpoint in response to real time inputs from handheld controllers 52a, 52b or other input devices. This allows the game player to see the world through the eyes of someone within or outside of the world. System 50 can be used for applications that do not require real time 3D interactive display (e.g., 2D display generation and/or non-interactive display), but the capability of displaying quality 3D images very quickly can be used to create very realistic and exciting game play or other graphical interactions.

To play a video game or other application using system 50, the user first connects a main unit 54 to his or her color television set 56 or other display device by connecting a cable 58 between the two. Main unit 54 produces both video signals and audio signals for controlling color television set 56. The video signals are what controls the images displayed on the television screen 59, and the audio signals are played back as sound through television stereo loudspeakers 61L, 61R.

The user also needs to connect main unit 54 to a power source. This power source may be a conventional AC adapter (not shown) that plugs into a standard home electrical wall socket and converts the house current into a lower DC voltage signal suitable for powering the main unit 54. Batteries could be used in other implementations.

The user may use hand controllers 52a, 52b to control main unit 54. Controls 60 can be used, for example, to specify the direction (up or down, left or right, closer or further away) that a character or other object (such as a racecar) displayed on television 56 should move within a 3D world. Controls 60 also provide input for other applications (e.g., menu selection, pointer/cursor control, etc.). Controllers 52 can take a variety of forms. In this example, controllers 52 shown each include controls 60 such as joysticks, push buttons and/or directional switches. Controllers 52 may be connected to main unit 54 by cables or wirelessly via electromagnetic (e.g., radio or infrared) waves.

To play an application such as a game, the user selects an appropriate storage medium 62 storing the video game or other application he or she wants to play, and inserts that storage medium into a slot 64 in main unit 54. Storage medium 62 may, for example, be a specially encoded and/or encrypted optical and/or magnetic disk. T the user may operate a power switch 66 to turn on main unit 54 and cause the main unit to begin running the video game or other application based on the software stored in the storage medium 62. The user may operate controllers 52 to provide inputs to main unit 54. For example, operating a control 60 may cause the game or other application to start. Moving other controls 60 can cause controlled objects to move in different directions or change the user's point of view in a 3D world. Depending upon the particular software stored within the storage medium 62, the various controls 60 on the controller 52 can perform different functions at different times.

As also shown in FIG. 19, mass storage device 62 stores, among other things, the collision detection engine E used to perform the collision detection and other features described in detail herein. The collision detection engine E in the preferred embodiment makes use of various components of system 50 shown in FIG. 10B including:

a main processor (CPU) 110,
a main memory 112, and
a graphics and audio processor 114.

In this example, main processor 110 (e.g., an enhanced IBM Power PC 750) receives inputs from handheld controllers 52 (and/or other input devices) via graphics and audio processor 114. Main processor 110 interactively responds to user inputs, and executes a video game or other program supplied, for example, by external storage media 62 via a mass storage access device 106 such as an optical disk drive. As one example, in the context of video game play, main processor 110 can perform collision detection and animation processing in addition to a variety of interactive and control functions.

In this example, main processor 110 generates 3D graphics and audio commands and sends them to graphics and audio processor 114. The graphics and audio processor 114 processes these commands to generate interesting visual images on display 59 and interesting stereo sound on stereo loudspeakers 61R, 61L or other suitable sound-generating devices. Main processor 110 and graphics and audio processor 114 also perform functions to support and implement the preferred embodiment collision detection engine E based on instructions and data E' relating to the engine that is stored in DRAM main memory 112 and mass storage device 62.

Figure 20:
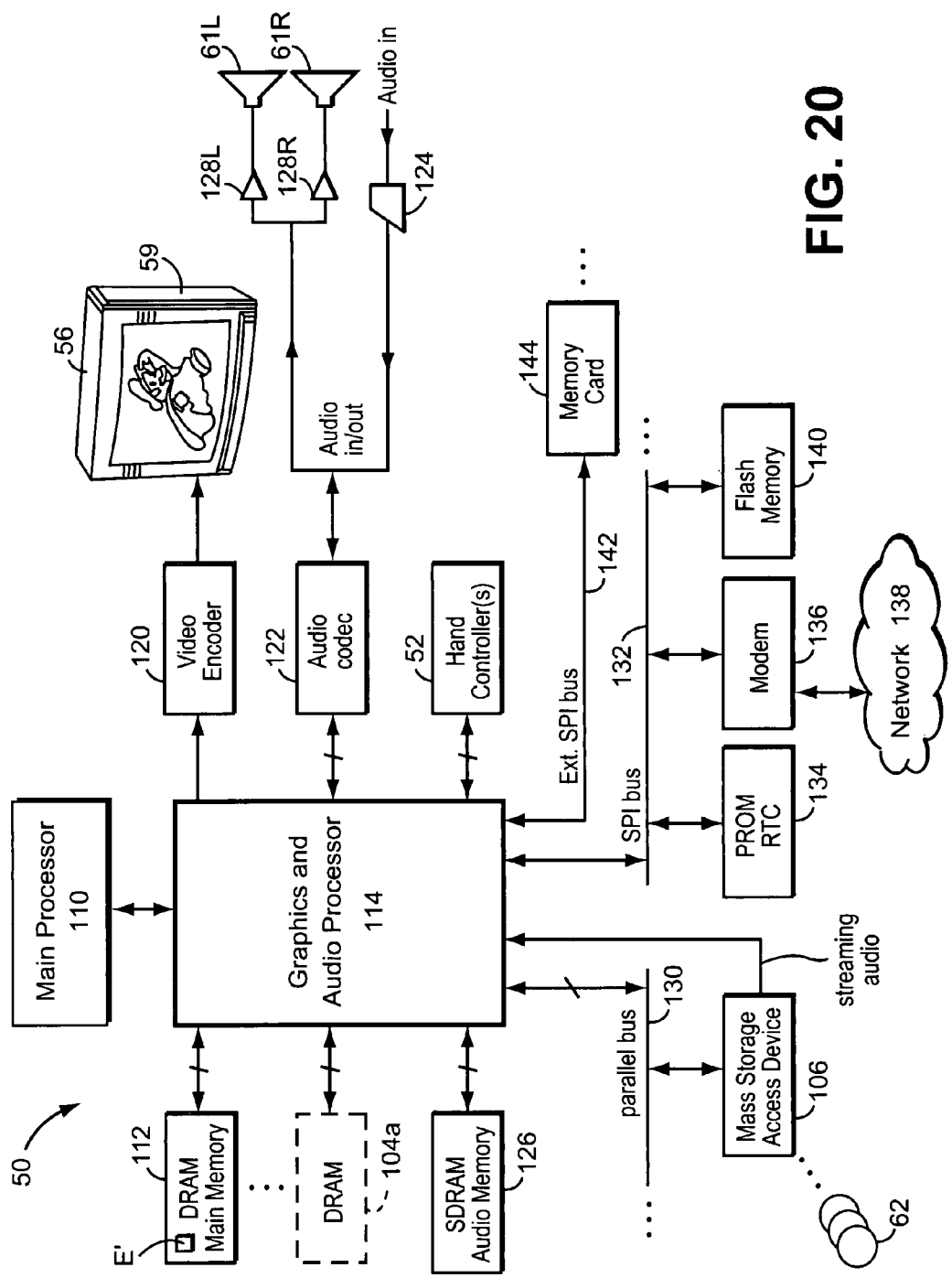

As further shown in FIG. 20, example system 50 includes a video encoder 120 that receives image signals from graphics and audio processor 114 and converts the image signals into analog and/or digital video signals suitable for display on a standard display device such as a computer monitor or home color television set 56. System 50 also includes an audio codec (compressor/decompressor) 122 that compresses and decompresses digitized audio signals and may also convert between digital and analog audio signaling formats as needed. Audio codec 122 can receive audio inputs via a buffer 124 and provide them to graphics and audio processor 114 for processing (e.g., mixing with other audio signals the processor generates and/or receives via a streaming audio output of mass storage access device 106). Graphics and audio processor 114 in this example can store audio related information in an audio memory 126 that is available for audio tasks. Graphics and audio processor 114 provides the resulting audio output signals to audio codec 122 for decompression and conversion to analog signals (e.g., via buffer amplifiers 128L, 128R) so they can be reproduced by loudspeakers 61L, 61R.

Graphics and audio processor 114 has the ability to communicate with various additional devices that may be present within system 50. For example, a parallel digital bus 130 may be used to communicate with mass storage access device 106 and/or other components. A serial peripheral bus 132 may communicate with a variety of peripheral or other devices including, for example:

a programmable read-only memory and/or real time clock 134,
a modem 136 or other networking interface (which may in turn connect system 50 to a telecommunications network 138 such as the Internet or other digital network from/to which program instructions and/or data can be downloaded or uploaded), and
flash memory 140.

A further external serial bus 142 may be used to communicate with additional expansion memory 144 (e.g., a memory card) or other devices. Connectors may be used to connect various devices to busses 130, 132, 142.

Collision detection engine E may be implemented for example by software executing on main processor 110.

As will be understood by one skilled in the art, various changes and modifications may be made in accordance with the invention. Thus, the above description is meant to be exemplary only and is not meant to limit the invention to the specific embodiments disclosed. The invention is not limited to race tracks or other road-like courses, but can be applied to any suitable gaming environment where smooth surface and efficient collision detection are desired.

What is claimed is:

1. A computer-implemented method for modeling a track, the method being performed using a computer including at least one processor to execute instructions tangibly stored on a computer readable storage medium, the method comprising:

defining, using the computer, a curved outer arc and an inner arc which together define an arc track section therebetween, and using splines to define height data for the arc track section, wherein a plurality of straight track sections are defined, each said straight track section being defined by a length and a width, and wherein each of the outer arc, the inner arc, and the curved arc track section is not defined using a plurality of straight track sections.

2. The method of claim 1, further including defining a plurality of said arc track sections and connecting the plurality of arc track sections together to form a continuous track.

3. The method of claim 1, further including defining an additional curved arc outside the outer arc to define an outer section of the arc track section and applying a different texture to the arc track section and the outer section.

4. A computer-implemented method for modeling a track, the method being performed using a computer including at least one processor to execute instructions tangibly stored on a computer readable storage medium, the method comprising:

defining, using the computer, a curved outer arc and an inner arc which together define an arc track section therebetween, and using splines to define height data for the arc track section, wherein the splines are one-dimensional Hermite Splines.

5. A computer-implemented method for modeling a track, the method being performed using a computer including at least one processor to execute instructions tangibly stored on a computer readable storage medium, the method comprising:

defining, using the computer, a plurality of curved arc track sections, wherein each arc track section is defined by an outer arc and an inner arc which together define the arc track section therebetween, and further wherein each arc track section uses splines to define height data for the arc track section;

defining, using the computer, a plurality of straight track sections, wherein each straight track section is defined by a length and width; and connecting the plurality and arc track sections and straight track sections together to form a continuous track, using the computer, wherein each said outer arc, inner arc, and curved arc track section is not defined using a plurality of straight track sections.

6. The method of claim 5, wherein the height of the arcs are defined by specifying an elevation and a height change for a starting point and an ending point of the arc and generating a spline using interpolation.

7. A computer-implemented for modeling a track for a video game, the method being performed using a computer including at least one processor to execute instructions tangibly stored on a computer readable storage medium, the method comprising:

defining, using a computer, a curved outer arc and an inner arc which together define an arc track section therebetween, using splines to define height data for the arc track section, and using the splines to add graphics to the track, wherein a plurality of straight track sections are defined, each said straight track section being defined by a length and a width, and wherein each of the outer arc, the inner arc, and the curved arc track section is not defined using a plurality of straight track sections.

8. A computer-implemented method of making track for use in a video game, the method being performed using a computer including at least one processor to execute instructions tangibly stored on a computer readable storage medium, the method comprising:

defining, using the computer, a plurality of curved arcs, wherein each arc is defined by a common origin and angle and a different radius and arc sections are defined between adjacent arcs, applying a different texture to each arc section, and using splines to add height information to each arc section, wherein a plurality of straight track sections are defined, each said straight track section being defined by a length and a width, and wherein each said arc and arc section is not defined using a plurality of straight track sections.

9. The method of claim 8, wherein the height information for each arc section is defined by specifying an elevation and a height change for a starting point and an ending point of the respective arc and generating a spline using interpolation.

\* \* \* \* \*